(12) United States Patent
Tsorng et al.

(10) Patent No.: US 10,750,630 B2
(45) Date of Patent: Aug. 18, 2020

(54) LOCKING MECHANISM FOR AN ADD-ON CARD

(71) Applicant: QUANTA COMPUTER INC., Taoyuan (TW)

(72) Inventors: Yaw-Tzorng Tsorng, Taoyuan (TW); Zhao-Hong Chen, Taoyuan (TW); Chun Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/234,789

(22) Filed: Dec. 28, 2018

(65) Prior Publication Data

US 2020/0068731 A1 Feb. 27, 2020

Related U.S. Application Data

(60) Provisional application No. 62/723,247, filed on Aug. 27, 2018.

(51) Int. Cl.
*H05K 5/02* (2006.01)
*H05K 7/14* (2006.01)
*H05K 7/16* (2006.01)

(52) U.S. Cl.
CPC ......... *H05K 5/0221* (2013.01); *H05K 5/0226* (2013.01); *H05K 5/0286* (2013.01);
(Continued)

(58) Field of Classification Search
CPC .. H05K 5/0221; H05K 7/1487; H05K 5/0226; H05K 7/16; H05K 7/1489; H05K 7/1405; H05K 5/0286
See application file for complete search history.

(56) References Cited

U.S. PATENT DOCUMENTS 6,351,379 B1 * 2/2002 Cheng .................. G11B 33/128
312/332.1
7,281,694 B2 10/2007 Allen et al.
(Continued)

FOREIGN PATENT DOCUMENTS

CN 102207753 A * 3/2010 ............... G06F 1/18
CN 102207753 A 10/2011
(Continued)

OTHER PUBLICATIONS

Extended European Search Report for EP Application No. 19164511.8, dated Oct. 24, 2019.
(Continued)

*Primary Examiner* — Rockshana D Chowdhury
(74) *Attorney, Agent, or Firm* — Nixon Peabody LLP

(57) ABSTRACT

An apparatus for securing an electronic component within a server device is provided. The apparatus includes a support bracket configured to secure the apparatus within the server device. The apparatus also includes a fixed structure rotatably housed within the support bracket. Moreover, the apparatus can include a hook structure connected to the fixed structure, such that the hook structure and the fixed structure are configured to rotate between an engaged position and a disengaged position. The hook structure can include a notch element configured to secure a corresponding element on the electronic component.

9 Claims, 20 Drawing Sheets

(52) U.S. Cl.
CPC ......... *H05K 7/1405* (2013.01); *H05K 7/1487* (2013.01); *H05K 7/1489* (2013.01); *H05K 7/16* (2013.01)

(56) References Cited

U.S. PATENT DOCUMENTS

| | | | |
|---|---|---|---|
| 9,152,189 B2 * | 10/2015 | Fan | ........................ G06F 1/187 |
| 2005/0059285 A1 | 3/2005 | Chen et al. | |
| 2011/0310576 A1 | 12/2011 | Chen | |
| 2015/0277514 A1 | 10/2015 | Farrow et al. | |
| 2016/0018859 A1 * | 1/2016 | Mao | ..................... H05K 7/1487 |
| | | | 361/679.58 |

FOREIGN PATENT DOCUMENTS

| | | |
|---|---|---|
| TW | M255439 U | 1/2005 |
| TW | I494042 B | 7/2015 |

OTHER PUBLICATIONS

Extended European Search Report for EP Application No. 19164511.8, dated Aug. 16, 2019.
TW Office Action for Application No. 108107308, dated Jan. 14, 2020, w/ First Office Action Summary.
TW Search Report for Application No. 108107308, dated Jan. 14, 2020, w/ First Office Action.

* cited by examiner

LOCKING MECHANISM FOR AN ADD-ON CARD

CROSS REFERENCE TO RELATED APPLICATIONS

This application claims priority under 35 U.S.C. § 119 to U.S. Provisional Application No. 62/723,247, entitled "THE LOW PROFILE TOOL LESS FIXED STRUCTURE FOR ADD-ON CARD," and filed on Aug. 27, 2018. The contents of that application are hereby incorporated by reference in their entirety.

FIELD OF THE INVENTION

The present invention relates to an apparatus for securing an add-on card within a server device.

BACKGROUND

A conventional server device typically includes a server mainboard, Peripheral Component Interface (PCI) slots, and an Intelligent Peripheral Management Interface (IPMI) compatible server management add-on card. The PCI slots are typically mounted on the server mainboard. An IPMI compatible server management add-on card can be removably mounted on one of the PCI slots.

The server mainboard has various electronic components. These components typically include a central processing unit, south and north bridge chipsets, a network card, a sensor, an input/output (I/O) controller, and a fan. Each of the PCI slots has a set of first electrical contacts coupled to the electronic components of the server mainboard.

The add-on card has a set of second electrical contacts for connecting electrically with the first electrical contacts. The add-on card is often used to permit remote monitoring and control of the electronic components on the server mainboard. The add-on card is typically mounted in place within the PCI slot using an add-on card locking mechanism. The locking mechanism is required to pass shock and vibration tests to ensure the add-on card is secured within the PCI slot. As a result, typical locking mechanisms are made up of rigid components that are not convenient to constantly engage and disengage. The present disclosure teaches a tool-less locking mechanism that is convenient to engage and disengage the add-on card.

SUMMARY

Embodiments of the disclosure concern an apparatus for securing an electronic component within a server device. The apparatus includes a support bracket. The apparatus also includes a fixed structure rotatably housed within the support bracket. Moreover, the apparatus can include a hook structure connected to the fixed structure, such that the hook structure and the fixed structure are configured to rotate between an engaged position and a disengaged position. The hook structure can include a notch element configured to secure a corresponding element on the electronic component.

In some embodiments of the disclosure, the fixed structure is secured within a receiving area of the support bracket and connected by a hinge device. In some embodiments of the disclosure, the apparatus can include two hook structures. A first hook structure can be located at a proximal end of the fixed structure, and a second hook structure can be located at a distal end of the fixed structure. The hook structure can include a first crest feature and a second crest feature, where both features are separated by a trough feature. A notch element can be located between the first crest feature and the trough feature.

In some embodiments, the hook structure can include a pressing region located at the first crest feature. The pressing region can be configured to receive a force that causes the hook structure and the fixed structure to rotate between the engaged position and the disengaged position. In some embodiments, the support bracket includes an aperture that corresponds with an aperture of the server device, where both apertures receive a fastener to secure the apparatus within the server device.

The disclosure is also directed towards a server device that includes a tray device, the apparatus described above, and an add-on card. The tray device is configured to secure the apparatus. The add-on card is configured to be secured within the server device by the apparatus. In some embodiments, the tray device includes a bridge component configured to secure the support bracket.

Embodiments of the disclosure also concern an alternative apparatus for securing an electronic component within a server device. The alternative apparatus can include a support bracket configured to secure the apparatus within the server device. The apparatus can also include a fixed structure mounted within the support bracket, such that the support bracket and the fixed structure are configured to slide between an engaged position and a disengaged position. In some embodiments, the fixed structure is secured within a receiving area of the support bracket.

In some embodiments of the disclosure, the support bracket includes elongated apertures, such that the apparatus is configured to slide between the engaged position and the disengaged position. In some embodiments, the fixed structure includes a lip feature and an aperture, where both features are configured to secure a corresponding element on the server device. In some embodiments, the lip feature is configured to receive a force that causes the support bracket and the fixed structure to slide between the engaged position and the disengaged position.

In the engaged position, the apparatus can be configured to lock an attachment between an engagement element of the electronic component and a securing element of the server device. The disclosure is also directed towards a server device that includes a tray device, the alternative apparatus described above, and an add-on card. The tray device can include a securing element. The tray device can also be configured to secure the apparatus. The add-on card can include an engagement element configured to connect to the securing element of the tray device. The add-on card can be secured within the server device by the alternative apparatus. Moreover, the tray device can include a bridge component configured to secure the support bracket.

Additional features and advantages of the disclosure will be set forth in the description that follows, and in part, will be obvious from the description; or can be learned by practice of the principles disclosed herein. The features and advantages of the disclosure can be realized and obtained by means of the instruments and combinations particularly pointed out in the appended claims. These and other features of the disclosure will become fully apparent from the following description and appended claims, or can be learned by the practice of the principles set forth herein.

BRIEF DESCRIPTION OF THE DRAWINGS

In order to describe the manner in which the above-recited disclosure and its advantages and features can be obtained, a more particular description of the principles described above will be rendered by reference to specific examples illustrated in the appended drawings. These drawings depict only example aspects of the disclosure, and are therefore not to be considered as limiting of its scope. These principles are described and explained with additional specificity and detail through the use of the following drawings.

DETAILED DESCRIPTION

Figure 1:
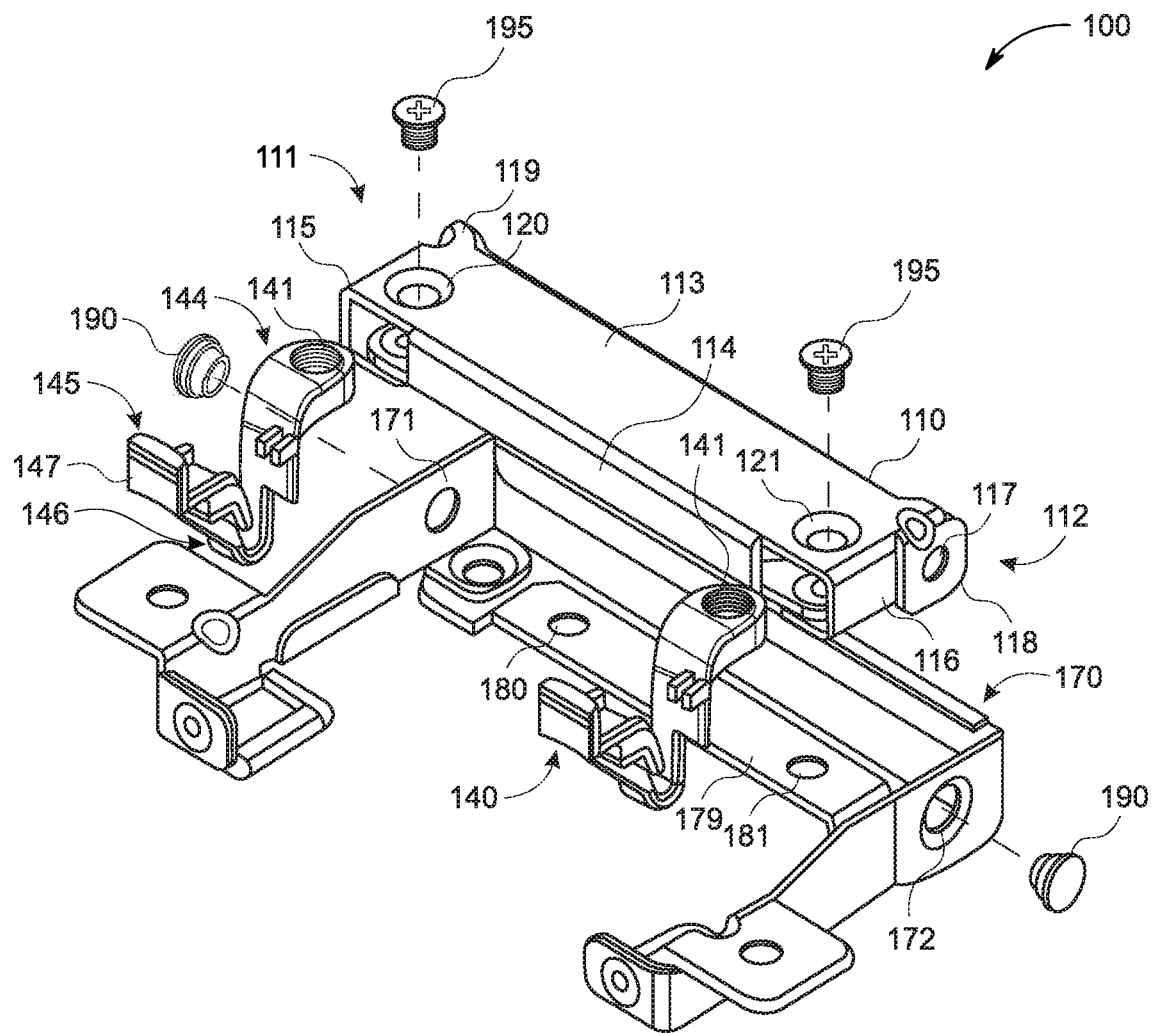
FIG. 1 is an exploded view of a locking mechanism, in accordance with an embodiment of the disclosure.

The present invention is described with reference to the attached figures, where like reference numerals are used throughout the figures to designate similar or equivalent elements. The figures are not drawn to scale, and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1 is an exploded view of a locking mechanism 100, in accordance with an embodiment of the disclosure. The locking mechanism 100 can include a fixed structure 110, a hook structure 140, and a support bracket 170. The fixed structure 110 is configured to secure the hook structure 140. The support bracket 170 is configured to house the fixed structure 110, such that the fixed structure 110 and the hook structure 140 are able to rotate between an engaged position and a disengaged position. The locking mechanism 100 is configured to secure an add-on card within a server device (not shown). This is illustrated below with respect to FIG. 8. The locking mechanism 100 can be designed to secure various types of add-on cards, such as, for example, an Intelligent Peripheral Management Interface (IPMI) compatible server management add-on card. The locking mechanism 100 and its components can be made of sheet metal using conventional metal fabrication techniques such as bending, forming, and stamping. In alternative embodiments, the locking mechanism 100 can be made from stainless steel, mild steel, or any material that is cost effective; and achieves high levels of hardness and corrosion resistance.

The fixed structure 110 can include an elongated body with a proximal end 111 and an opposing distal end 112. The fixed structure 110 can also include a top surface 113, a side surface 114, a first side surface 115 at the proximal end 111, and a second side surface 116 at the distal end 112. The second side surface 116 can have an aperture 117 configured to receive a fastener to secure the fixed structure 110 to the support bracket 170. The aperture 117 can be located on a tab 118. The first side surface 115 can also have a corresponding aperture (not shown) configured to receive a fastener to secure the fixed structure 110 to the support bracket 170. The aperture of the first side surface 115 can be located on a tab 119. The apertures on both sides can be aligned with each other and with apertures 171, 172 located on the support bracket 170, such that the two pieces are mated together. The fixed structure 110 and the support bracket 170 can be mated together using any connectors or fasteners, such as nuts and bolts, screws, or the like. For the purposes of this example, the apertures of both the fixed structure 110 and the support bracket 170 are configured to receive a pivot element 190. The pivot element 190 not only connects both structures, but it also enables the fixed structure 110 to rotate within the support bracket 170.

The support bracket 170 can include a receiving area 179 configured to house the fixed structure 110. The receiving area 179 can include apertures 180 and 181. The apertures 180, 181 are configured to align with apertures in a tray device (not shown) to secure the locking mechanism 100 to the tray device. This is discussed in greater detail below with respect to FIG. 4.

The side surface 114 of the fixed structure 110 can have openings to receive the hook structure 140. The top surface 113 of the fixed structure 110 can have multiple apertures as well. The proximal end 111 of the top surface 113 can have aperture 120. Whereas, the distal end 112 of the top surface 113 can have aperture 121. While the locking mechanism 100 of FIG. 1 illustrates two hook structures 140, it should be understood that any number of hook structures 140 can be implemented herein. The apertures 120, 121 can be aligned with each other and with receiving elements 141 located on the hook structure 140, such that the two pieces are mated together. Specifically, the hook structure 140 and the fixed structure 110 can be mated together using any connectors or fasteners, such as nuts and bolts, screws, or the like. For the purposes of this example in FIG. 1, the apertures 120, 121 of the fixed structure 110 and the receiving elements 141 of the hook structure 140 are configured to receive a securing element 195. The receiving elements 141 can include threading configured to receive the securing element 195 to secure the fixed structure 110 to the hook structure 140.

The hook structure 140 can include a first crest feature 144 and a second crest feature 145 separated by a trough feature 146. The receiving element 141 can be located at the first crest feature 144. The trough feature 146 can be configured to interface with an add-on card (not shown). The second crest feature 145 can include a pressing region 147. The pressing region 147 can be configured to receive a force to rotate the hook structure 140 (and the fixed structure 110) between the engaged and disengaged positions. This is discussed in greater detail below.

Figure 2:
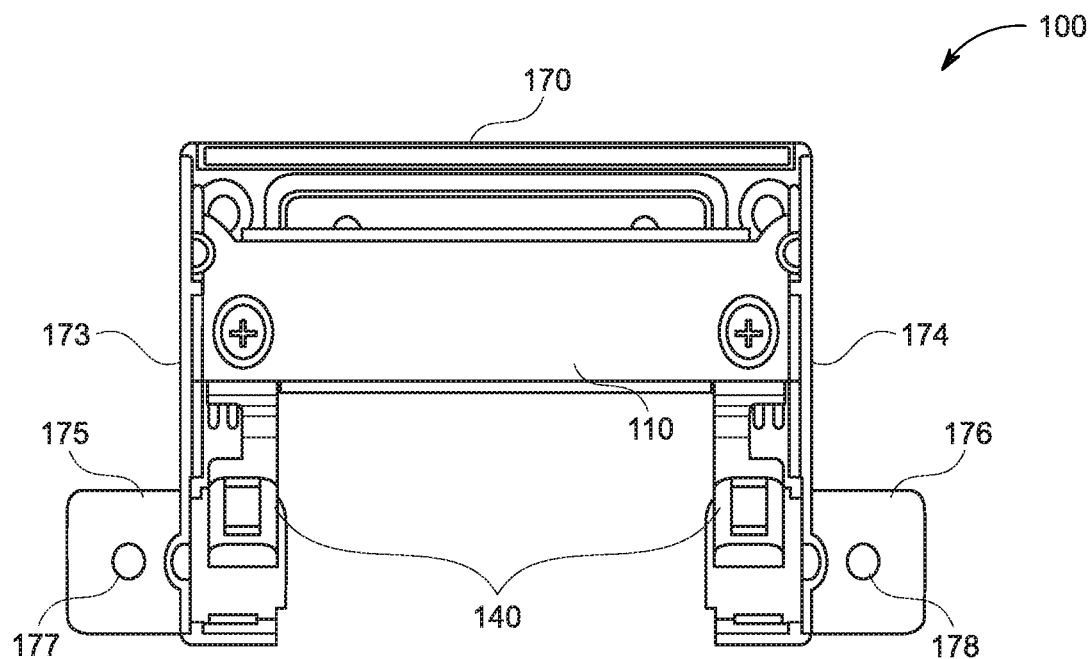
FIG. 2 illustrates a top profile of the locking mechanism of FIG. 1, in accordance with an embodiment of the disclosure.
Figure 3:
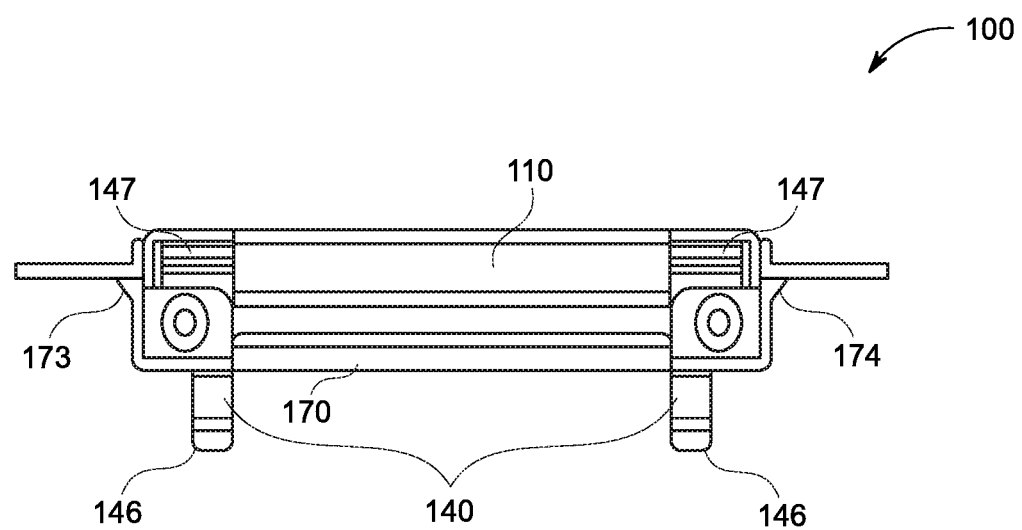
FIG. 3 illustrates a front profile of the locking mechanism of FIG. 1, in accordance with an embodiment of the disclosure.

FIGS. 2 and 3 illustrate a top and front profile of the locking mechanism 100, respectively. Referring to FIG. 2, the support bracket 170 can include a proximal end 173 and a distal end 174. The support bracket 170 includes a first tab 175 at the proximal end 173. The first tab 175 can include an aperture 177. Similarly, the support bracket 170 includes a second tab 176 at the distal end 174. The second tab 176 can include an aperture 178. The locking mechanism 100 can be secured to a tray device (not shown) using any connectors or fasteners, such as nuts and bolts, screws, or the like. The apertures 177, 178 are configured to receive the connectors or fasteners.

FIGS. 2 and 3 illustrate the locking mechanism 100 in the engaged position. In this position, the hook structure 140 and the fixed structure 110 are secured within the support bracket 170. As illustrated in FIG. 3, the trough feature 146 of the hook structure 140 protrudes from the base of the locking mechanism 100 in the engaged position. The trough feature 146 is configured to secure an add-on card in this position. The pressing region 147 also protrudes from the top of the locking mechanism 100 in the engaged position. The pressing region 147 is configured to receive a force to disengage the locking mechanism 100, and release the add-on card.

Figure 4:
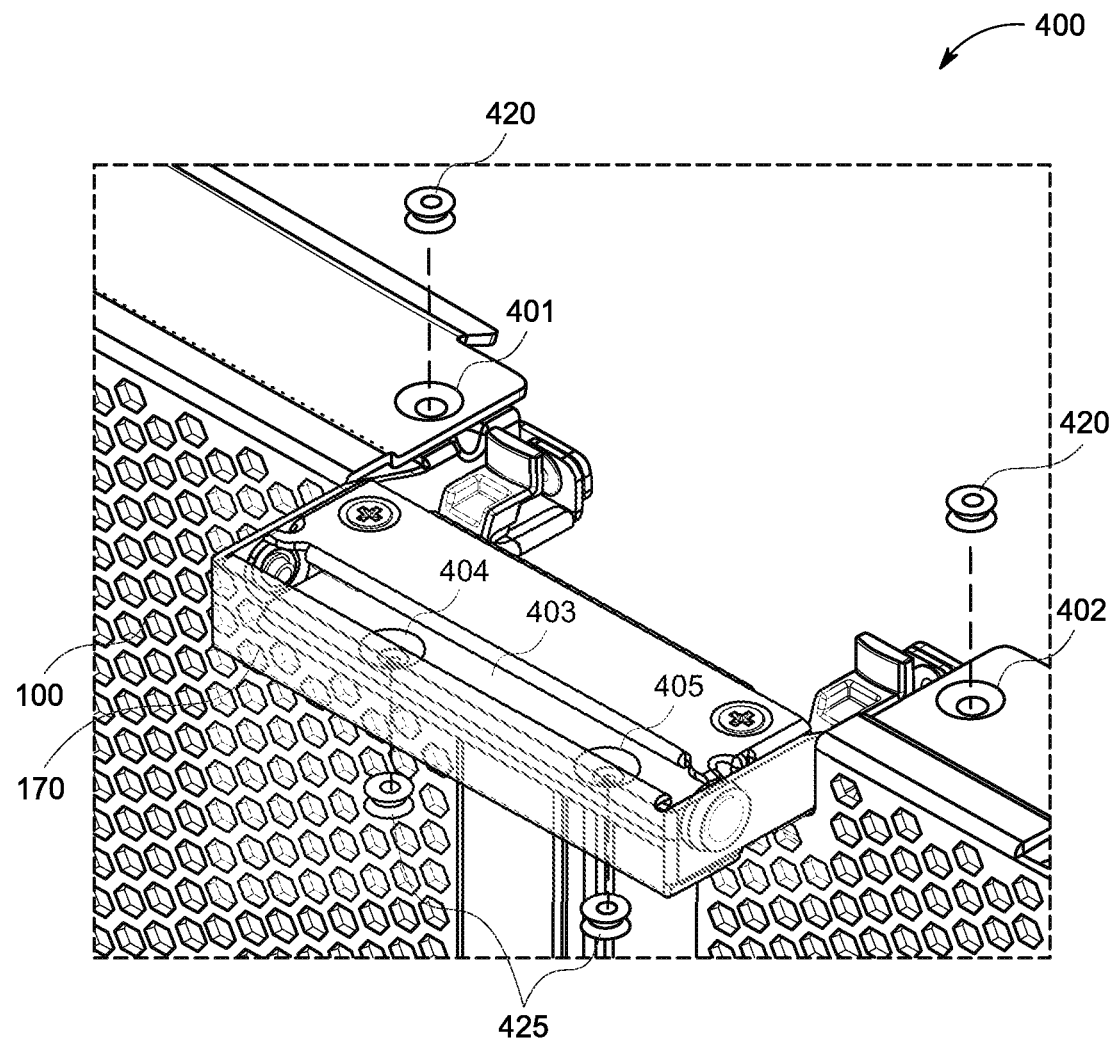
FIG. 4 illustrates the locking mechanism of FIG. 1 mounted on a tray device, in accordance with an embodiment of the disclosure.

FIG. 4 illustrates the locking mechanism 100 mounted on a tray device 400, in accordance with an embodiment of the disclosure. The tray device 400 can include aperture 401 and aperture 402. The apertures 401, 402 can be aligned with each other and with the apertures (not visible in FIG. 4, but described above [177, 178] with respect to FIG. 2) of the support bracket 170, such that the two pieces are mated together. The tray device 400 and the support bracket 170 can be mated together using any connectors or fasteners, such as rivets, nuts and bolts, screws, or the like. For the purposes of this example in FIG. 4, the apertures of both the tray device 400 and the support bracket 170 are configured to receive a rivet 420. The tray device 400 can also include a bridge 403. The bridge 403 is configured to connect with the support bracket 170 of the locking mechanism 100. The bridge 403 can include apertures 404 and 405. The apertures 404, 405 can be aligned with each other and with apertures (not visible in FIG. 4, but described above [180, 181] with respect to FIG. 1) of the support bracket 170, such that the two pieces are mated together. The bridge 403 and the support bracket 170 can be mated together using any connectors or fasteners, such as rivets, nuts and bolts, screws, or the like. For the purposes of this example in FIG. 4, the apertures of both the bridge 403 and the support bracket 170 are configured to receive a rivet 425. While other fasteners or connectors can be implemented herein, rivets 420, 425 provide a cost efficient manner of fastening the locking mechanism 100 to the tray device 400.

Figure 5:
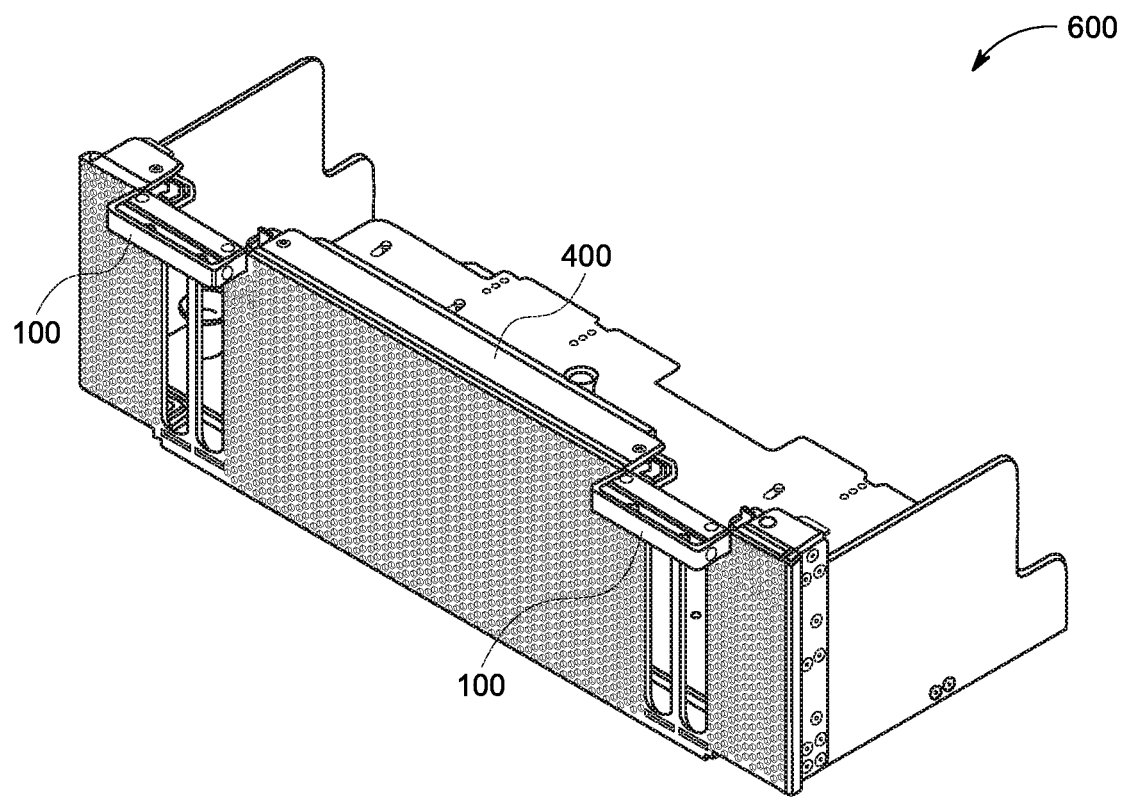
FIG. 5 illustrates more than one locking mechanisms mounted on a tray device within a server device, in accordance with an embodiment of the disclosure.

It should be understood that multiple locking mechanisms 100 can be mounted on the tray device 400. FIG. 5 illustrates two locking mechanisms 100 mounted on the tray device 400. The tray device 400 can be installed into a server device 600. While mounted within the server device 600, the locking mechanism 100 can be engaged and disengaged to receive an add-on card. This process is discussed below with respect to FIGS. 6 and 7.

Figure 6:
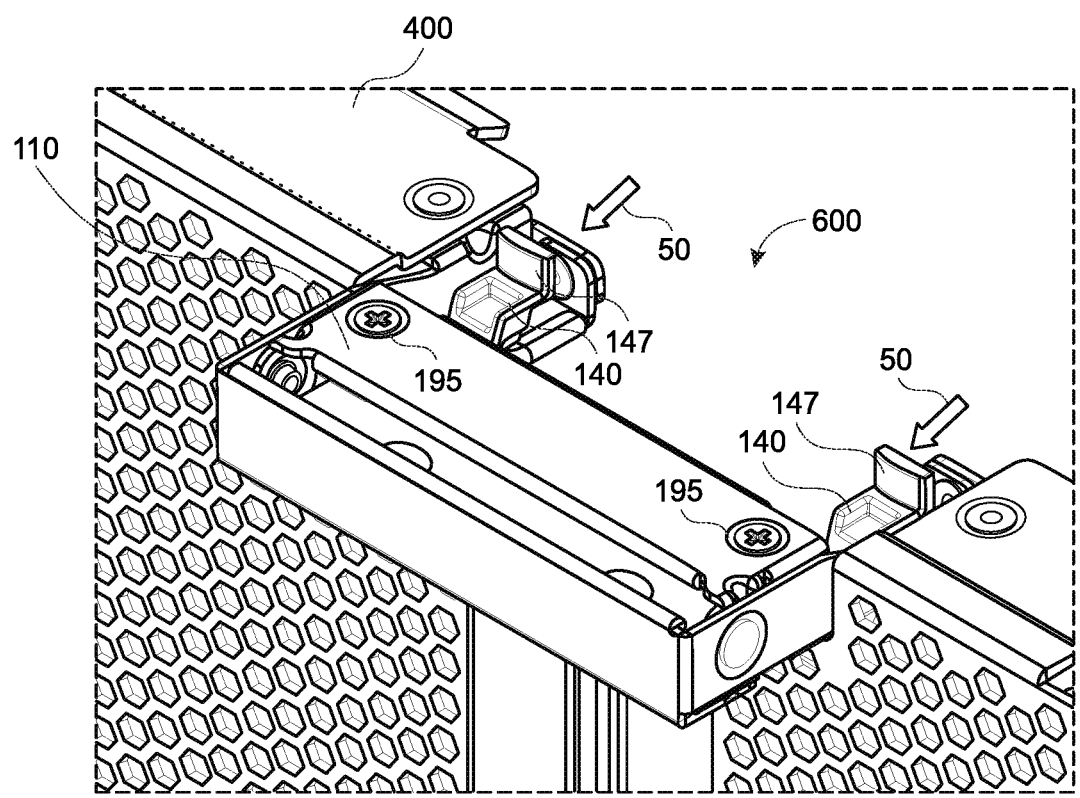
FIG. 6 illustrates a force applied to disengage the locking mechanism within a server device, in accordance to one or more embodiments of the disclosure.
Figure 7:
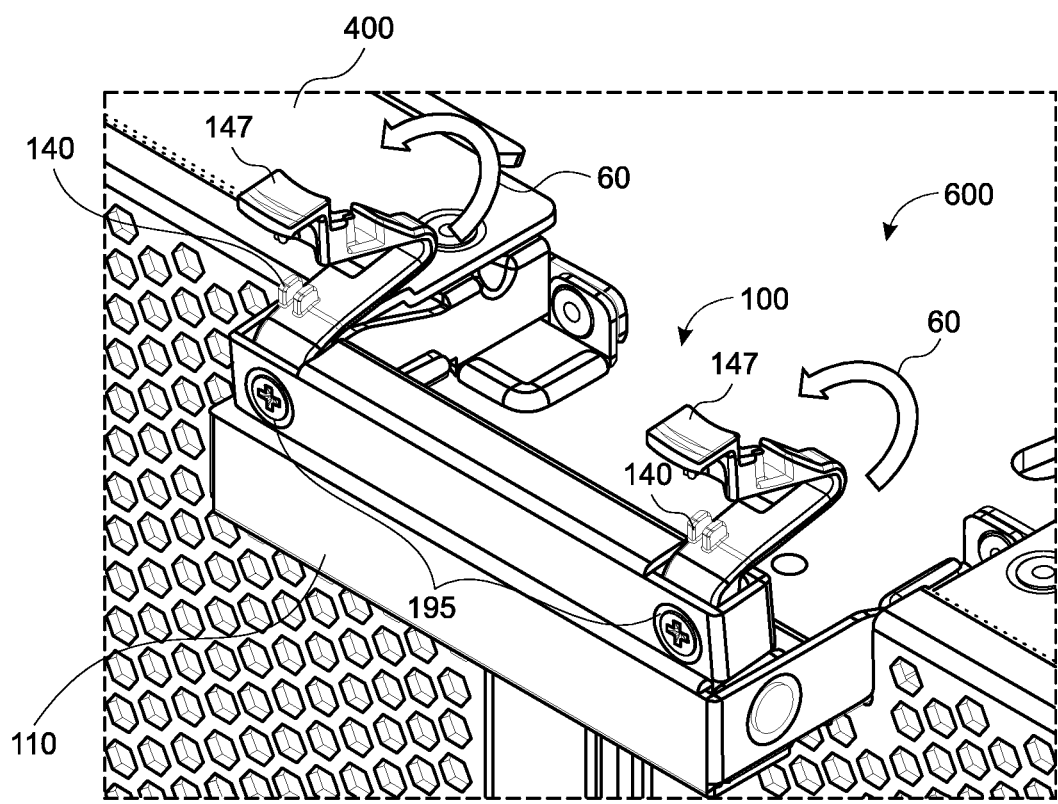
FIG. 7 illustrates the disengaged locking mechanism within a server device, in accordance to one or more embodiments of the disclosure.

FIG. 6 illustrates a force 50 applied to disengage the locking mechanism 100 within the server device 600. Specifically, the force 50 can be applied to the pressing region 147 of the hook structure 140. As described above, the hook structure 140 is connected to the fixed structure 110 by way of securing element 195 (as shown in FIG. 1). As a result, the force 50 not only rotates the hook structure 140, but also the fixed structure 110. FIG. 7 illustrates the disengaged locking mechanism 100 within server device 600. The hook structure 140 and the fixed structure 110 are rotated about direction 60. The disengagement allows for loading and unloading of an add-on card.

Figure 8:
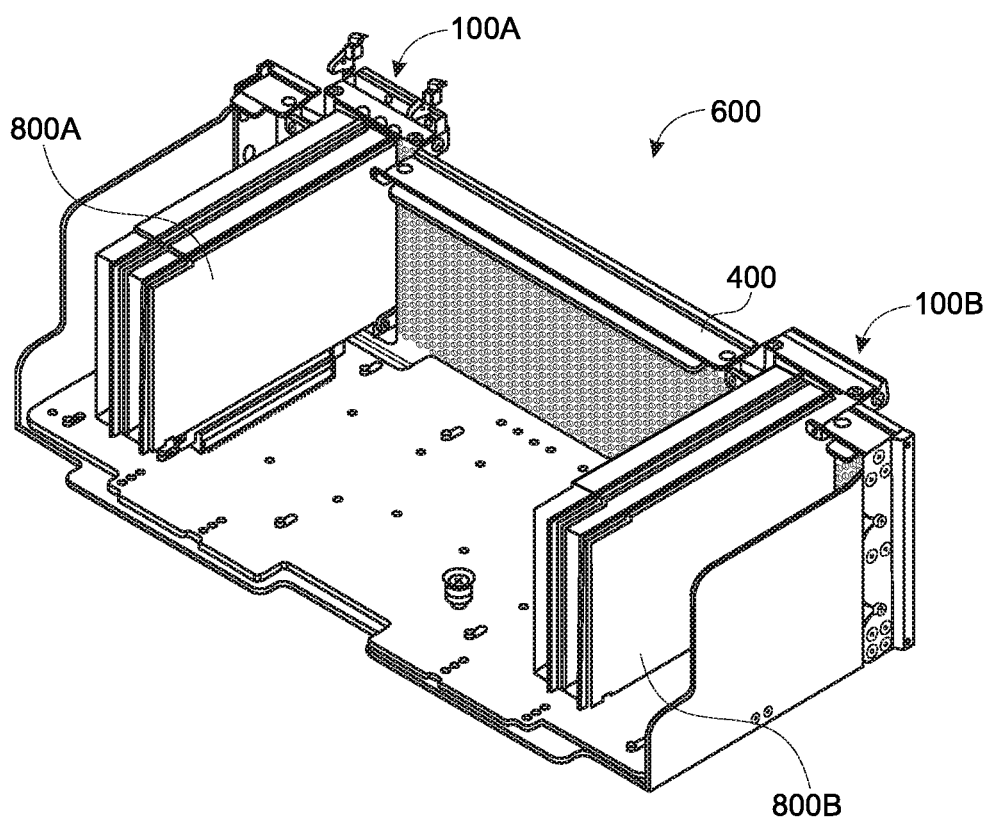
FIG. 8 illustrates multiple add-on cards secured within the server device by the locking mechanism, in accordance to one or more embodiments of the disclosure.

FIG. 8 illustrates multiple add-on cards 800A and 800B secured within the server device 600 by the locking mechanisms 100A and 100B, respectively. The add-on cards 800A are within the server device 600 but are not secured. As illustrated in FIG. 8, the locking mechanism 100A is in the disengaged position. In contrast, the locking mechanism 100B is in the engaged position to secure the add-on cards 800B. The engaged position of the locking mechanism 100B secures the add-on card by interfacing the hook structure with a mating component on each of the add-on card 800B. This is discussed in further detail below with respect to FIGS. 10A and 10B.

Figure 9A:
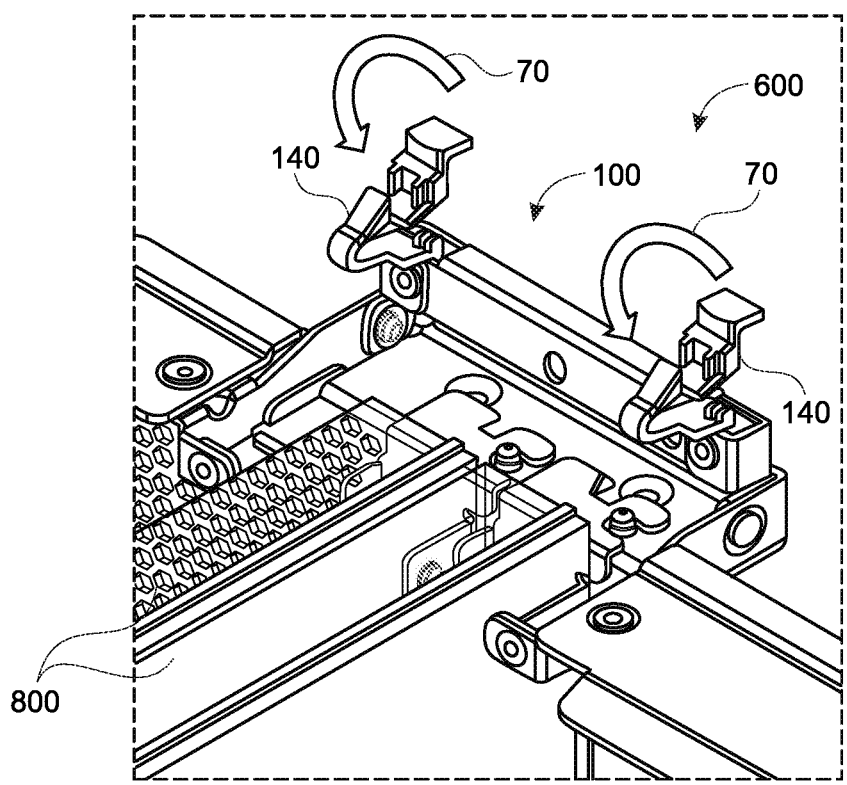
FIG. 9A illustrates a first force applied to engage the locking mechanism within a server device, in accordance to one or more embodiments of the disclosure.
Figure 9B:
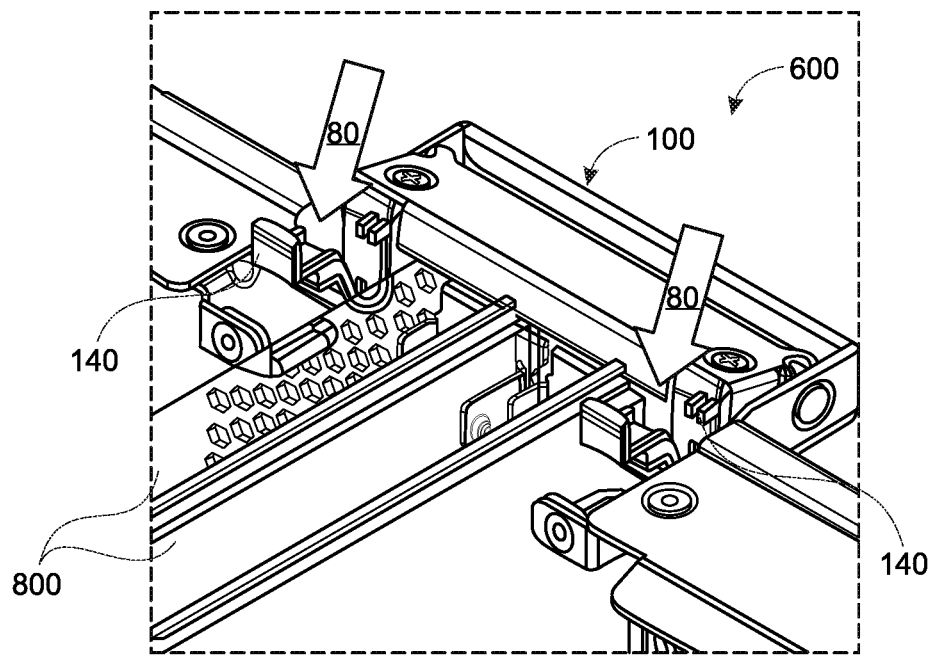
FIG. 9B illustrates a second force applied to engage the locking mechanism within a server device, in accordance to one or more embodiments of the disclosure.
Figure 9C:
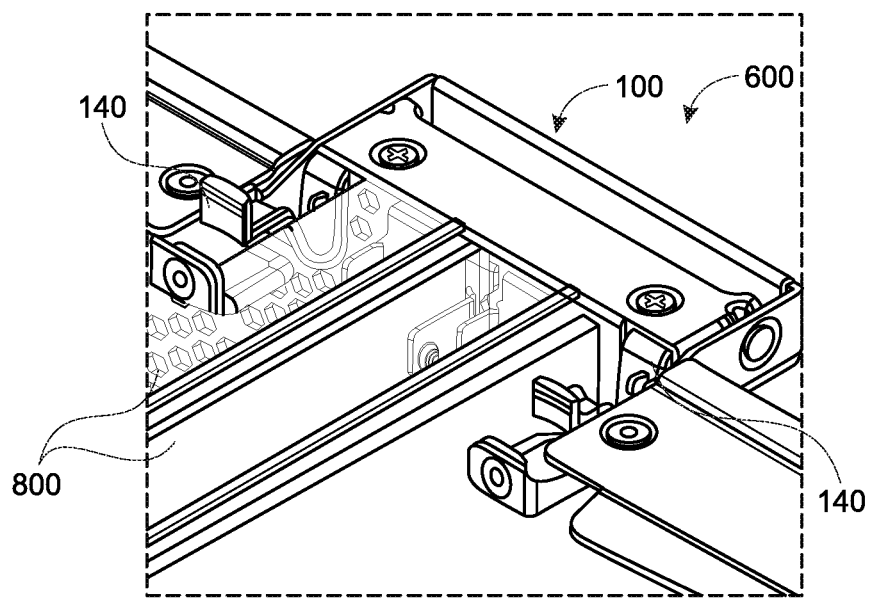
FIG. 9C illustrates an engaged locking mechanism securing an add-on card within a server device, in accordance to one or more embodiments of the disclosure.
Figure 10A:
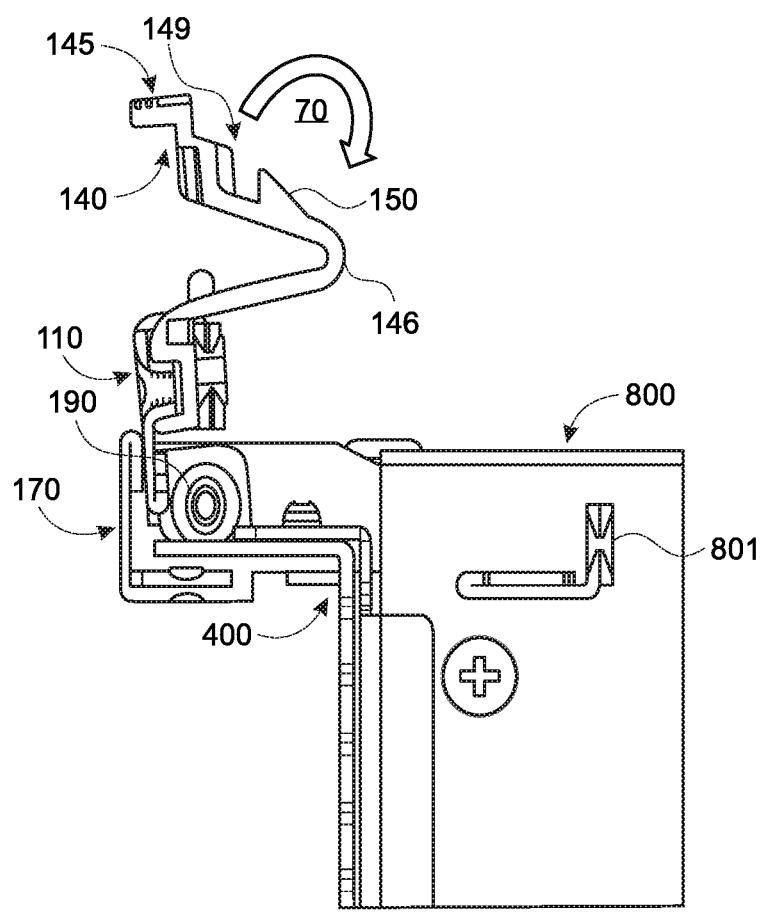
FIG. 10A illustrates a side profile of applying a force to engage the locking mechanism within a server device, in accordance to one or more embodiments of the disclosure.
Figure 10B:
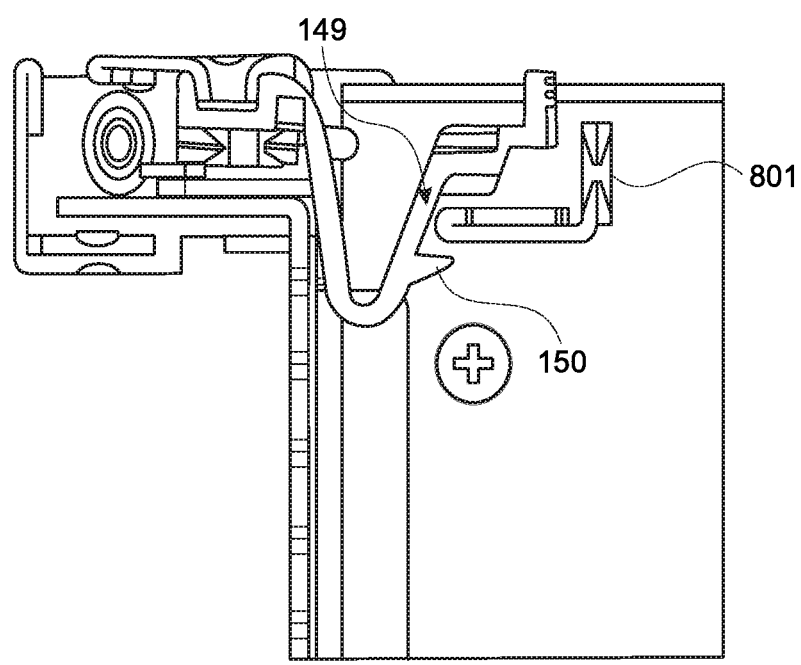
FIG. 10B illustrates a side profile of engaged locking mechanism securing an add-on card within a server device, in accordance to one or more embodiments of the disclosure.

FIG. 9A illustrates a first force 70 applied to engage the locking mechanism 100 within the server device 600. The hook structure 140 is first rotated towards the add-on cards 800. FIG. 9B illustrates a second force 80 applied to engage the locking mechanism 100 within the server device 600. The add-on card 800 can have a securing element configured to engage with the hook structure 140 of the locking mechanism 100. The second force 80 causes the hook structure 140 to engage with the securing element of the add-on card. This is illustrated in FIGS. 10A and 10B. FIG. 9C illustrates the engaged locking mechanism 100 securing the add-on card 800 within a server device 600.

FIG. 10A illustrates a side profile of applying the first force 70 to engage the locking mechanism 100 to secure the add-on card 800. The hook structure 140 can have a notch element 149 located between the second crest 145 and the trough feature 146. The notch element 149 can include a tab element 150. As the hook structure 140 is rotated about the pivot element 190, the trough feature 146 will contact the securing element 801 on the add-on card 800. As the hook structure 140 is pushed down (see FIG. 9B), the securing element 801 is advanced past the tab element 150 until it locks into the notch element 149. Once the securing element 801 is locked into the notch element 149, the add-on card is secured within the server device 600. FIG. 10B illustrates a side profile of the engaged locking mechanism 100 securing the add-on card 800 within the server device 600.

Figure 11:
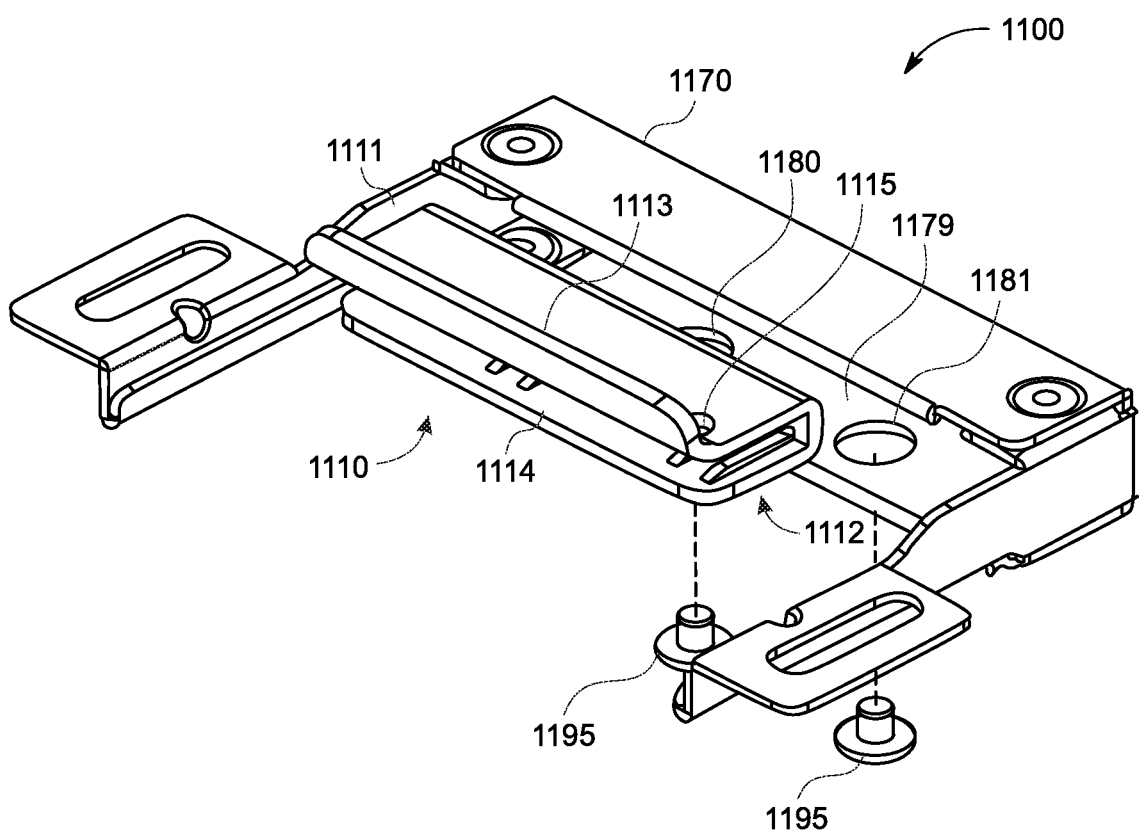
FIG. 11 is an exploded view of a locking mechanism, in accordance with an embodiment of the disclosure.

FIG. 11 is an exploded view of a locking mechanism 1100, in accordance with an embodiment of the disclosure. The locking mechanism 1100 can include a fixed structure 1110 and a support bracket 1170. The support bracket 1170 is configured to house the fixed structure 1110, such that the support bracket 1170 and the fixed structure 110 are able to slide between an engaged position and a disengaged position. The locking mechanism 1100 is configured to secure an add-on card within a server device (not shown). This is illustrated below with respect to FIG. 18. The locking mechanism 1100 can be designed to secure various types of add-on cards, such as, for example, an Intelligent Peripheral Management Interface (IPMI) compatible server management add-on card. The locking mechanism 1100 and its components can be made of sheet metal using conventional metal fabrication techniques such as bending, forming, and stamping. In alternative embodiments, the locking mechanism 1100 can be made from stainless steel, mild steel, or any material that is cost effective, and achieves high levels of hardness and corrosion resistance.

The fixed structure 1110 can include an elongated body with a proximal end 1111 and an opposing distal end 1112. The fixed structure 1110 can also include a lip feature 1113 along the length of the elongated body. The lip feature 1113 of the fixed structure 1110 can be near an opening 1114 configured to receive securing elements of a tray device (not shown). The fixed structure 1110 can also have an aperture 1115 in its top surface to secure the securing elements. This is discussed in greater detail below with respect to FIGS. 19A, 19B, and 19C.

The support bracket 1170 can include a receiving area 1179 configured to receive the fixed structure 1110. The receiving area 1179 can include apertures 1180 and 1181. The apertures 1180, 1181 are configured to align with apertures in the fixed device 1110 (not pictured) to secure the locking mechanism 1100 within the server device (not shown). The apertures 1180, 1181 can be aligned with each other and with the apertures of the fixed device 1110, such that the two pieces are mated together using any connectors or fasteners, such as nuts and bolts, screws, or the like. For the purposes of this example, the apertures of both the fixed structure 1110 and the support bracket 1170 are configured to receive a screw 1195.

Figure 12:
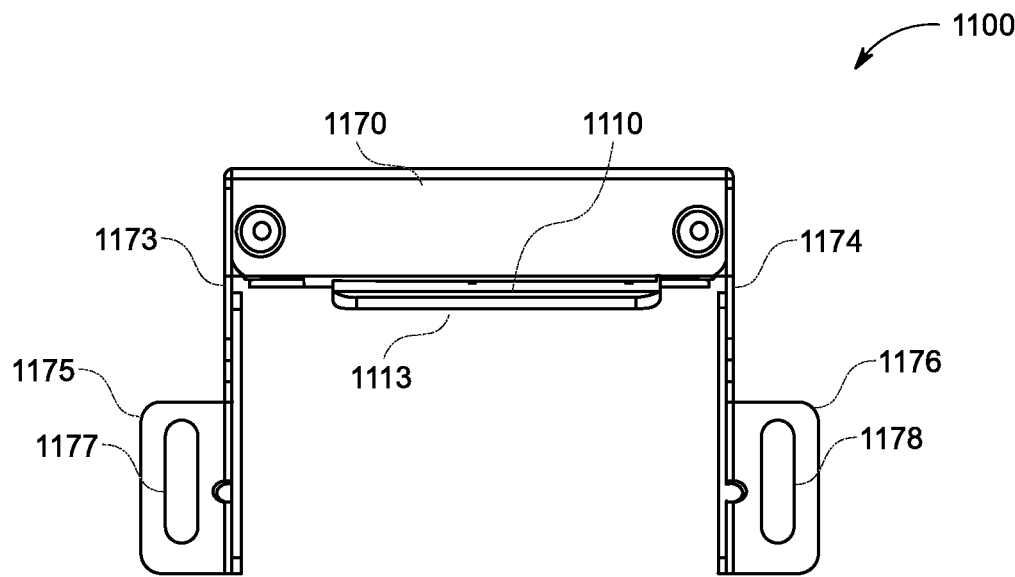
FIG. 12 illustrates a top profile of the locking mechanism of FIG. 1, in accordance with an embodiment of the disclosure.
Figure 13:
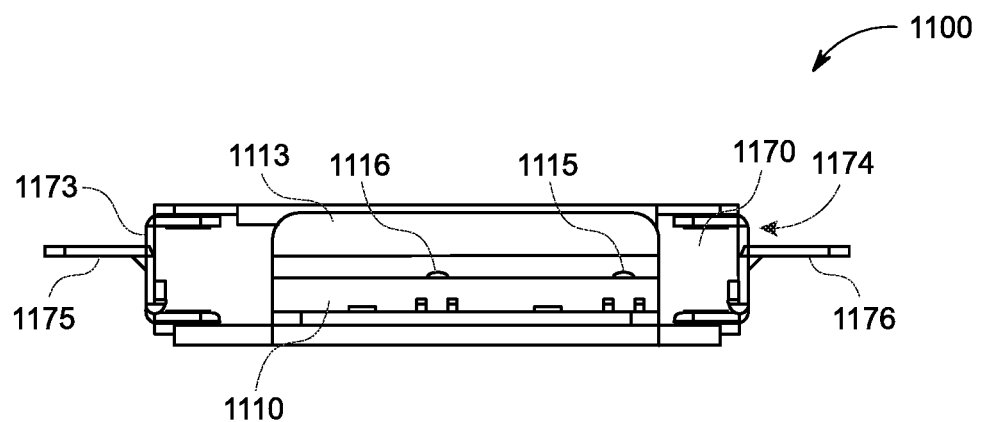
FIG. 13 illustrates a front profile of the locking mechanism of FIG. 1, in accordance with an embodiment of the disclosure.

FIGS. 12 and 13 illustrate a top and front profile of the locking mechanism 1100, respectively. Referring to FIG. 12, the support bracket 1170 can include a proximal end 1173 and a distal end 1174. The support bracket 1170 includes a first tab 1175 at the proximal end 1173. The first tab 1175 can include an elongated aperture 1177. Similarly, the support bracket 1170 includes a second tab 1176 at the distal end 1174. The second tab 1176 can include an elongated aperture 1178. The locking mechanism 1100 can be secured to a tray device (not shown) using any connectors or fasteners, such as rivets, nuts and bolts, screws, or the like. The apertures 1177, 1178 are configured to receive the connectors or fasteners. The elongated features of the apertures 1177, 1178 enables the locking mechanism 1100 to slide between an engaged position and a disengaged position. Referring momentarily to FIG. 13, apertures 1115 and 1116 of the fixed structure 1110 are visible. The apertures 1115 and 1116 are located just behind the lip feature 1113.

FIGS. 12 and 13 illustrate the locking mechanism 1100 in the engaged position. Referring specifically to FIG. 12, the lip feature 1113 of the fixed structure 1110 slightly protrudes from the locking mechanism 1100 in the engaged position. The lip feature 1113 is configured to secure an add-on card (now shown) in this position. The lip feature 1113 is also configured to receive a force to disengage the locking mechanism 1100, and release the add-on card.

Figure 14:
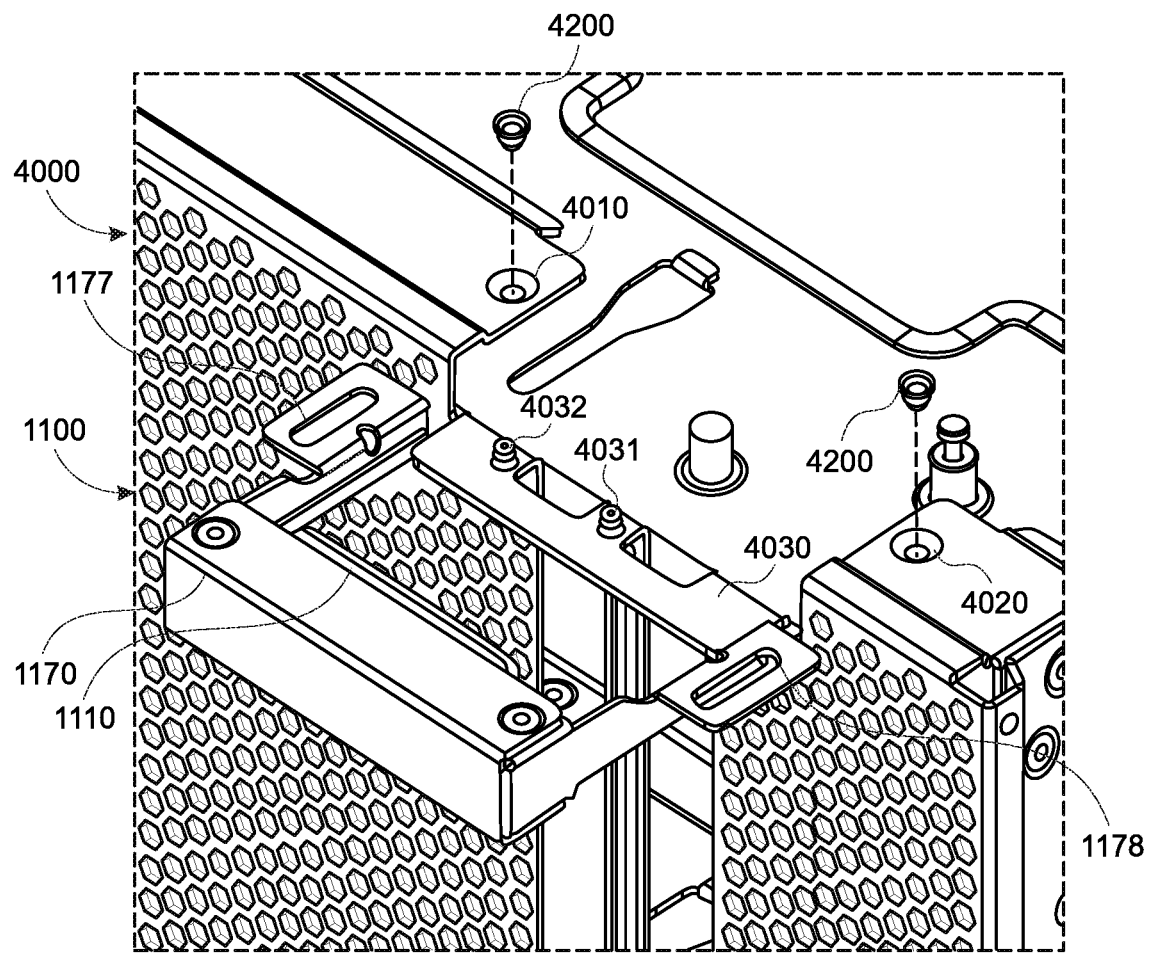
FIG. 14 illustrates the locking mechanism of FIG. 1 mounted on a tray device, in accordance with an embodiment of the disclosure.

FIG. 14 illustrates the locking mechanism 1100 mounted on a tray device 4000, in accordance with an embodiment of the disclosure. The tray device 4000 can include aperture 4010 and aperture 4020. The apertures 4010, 4020 can be aligned with each other and with the elongated apertures 1177, 1178 of the support bracket 1170, such that the two pieces are mated together using any connectors or fasteners, such as rivets, nuts and bolts, screws, or the like. For the purposes of this example in FIG. 14, the apertures of both the tray device 4000 and the support bracket 1700 are configured to receive a pivot element 4200. The tray device 4000 can also include a bridge 4030. The bridge 4030 includes securing elements 4031 and 4032. The securing elements 4031 and 4032 are configured to connect with the fixed structure 1110 of the locking mechanism 1100. The securing elements 4031 and 4032 can be aligned with each other and with apertures (not visible in FIG. 14, but described above [1115, 1116] with respect to FIG. 12B) of the fixed structure 1110, such that the two pieces are mated together.

Figure 15:
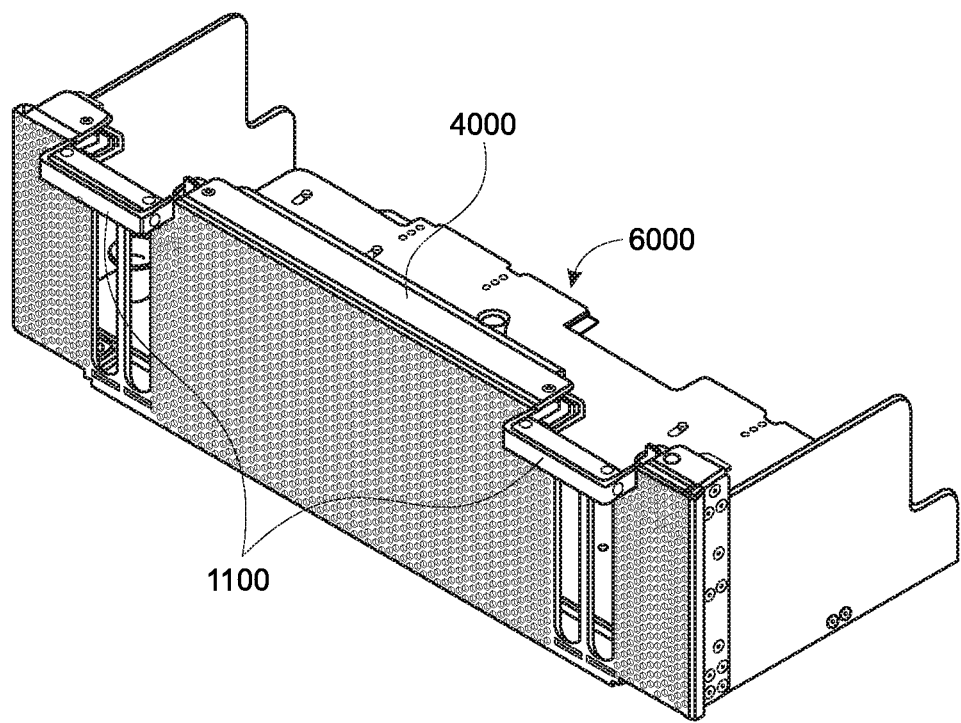
FIG. 15 illustrates more than one locking mechanisms mounted on a tray device, in accordance with an embodiment of the disclosure.

It should be understood that multiple locking mechanisms 1100 can be mounted on the tray device 4000. FIG. 15 illustrates two locking mechanisms 1100 mounted on the tray device 4000 within a server device 6000. While mounted within the server device 6000, the locking mechanism 1100 can be engaged and disengaged to receive an add-on card. This process is discussed below with respect to FIGS. 16 and 17.

Figure 16:
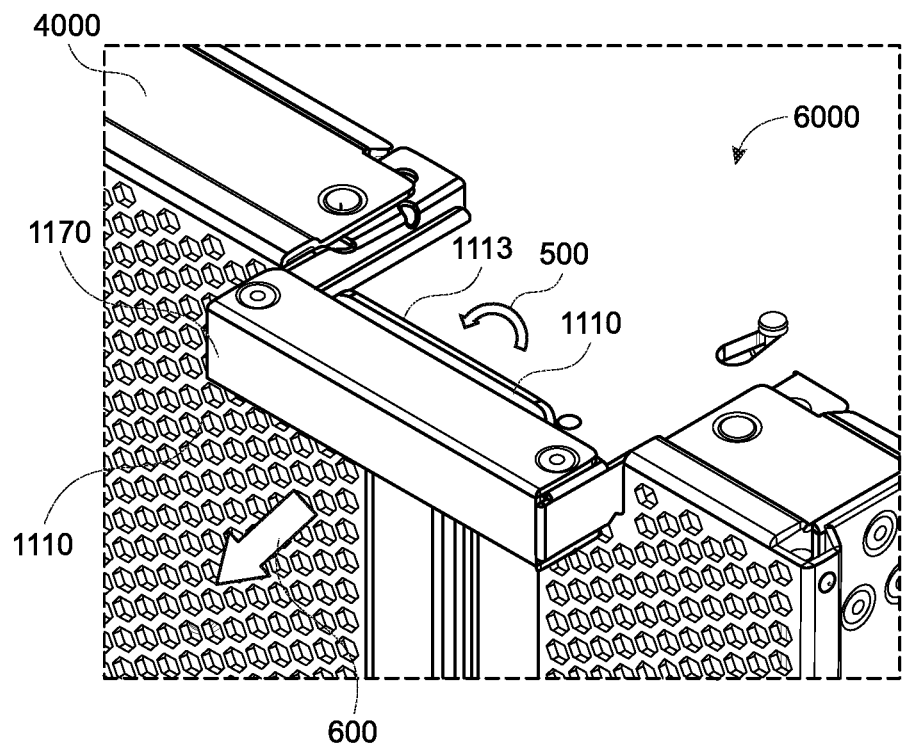
FIG. 16 illustrates mounting the tray device of FIG. 5 within a server device, according to one or more embodiments of the disclosure.

FIG. 16 illustrates a first force 500 applied to disengage the locking mechanism 1100 within the server device 6000.

Figure 17:
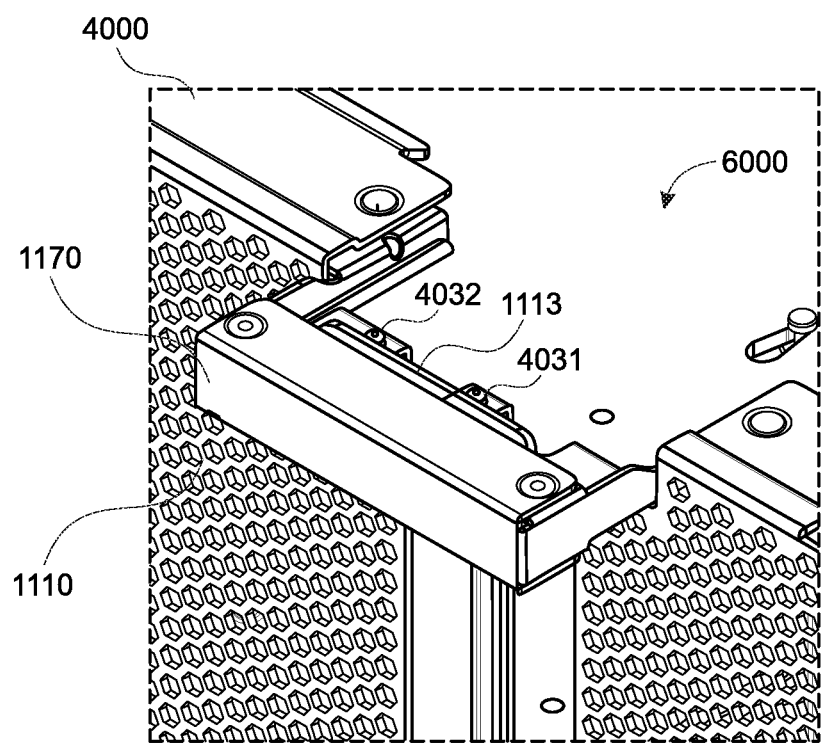
FIG. 17 illustrates the disengaged locking mechanism within a server device, in accordance to one or more embodiments of the disclosure.

FIG. 17 illustrates the disengaged locking mechanism 1100 within 6000 server device. Referring specifically to FIG. 16, the force 500 can be applied to the lip feature 1113 of the fixed structure 1110. The force 500 is able to lift the lip feature 1113 enough to provide clearance for the securing elements 4031, 4032 (shown in FIG. 17) of the tray 4000, thus disengaging the locking mechanism 1100. As described above, the fixed structure 1110 is connected to the support bracket 1170. As a result, the force 500 not only lifts the lip feature 1113, but drives the support bracket 1170 in direction 600. The disengagement allows for loading and unloading of an add-on card.

Figure 18:
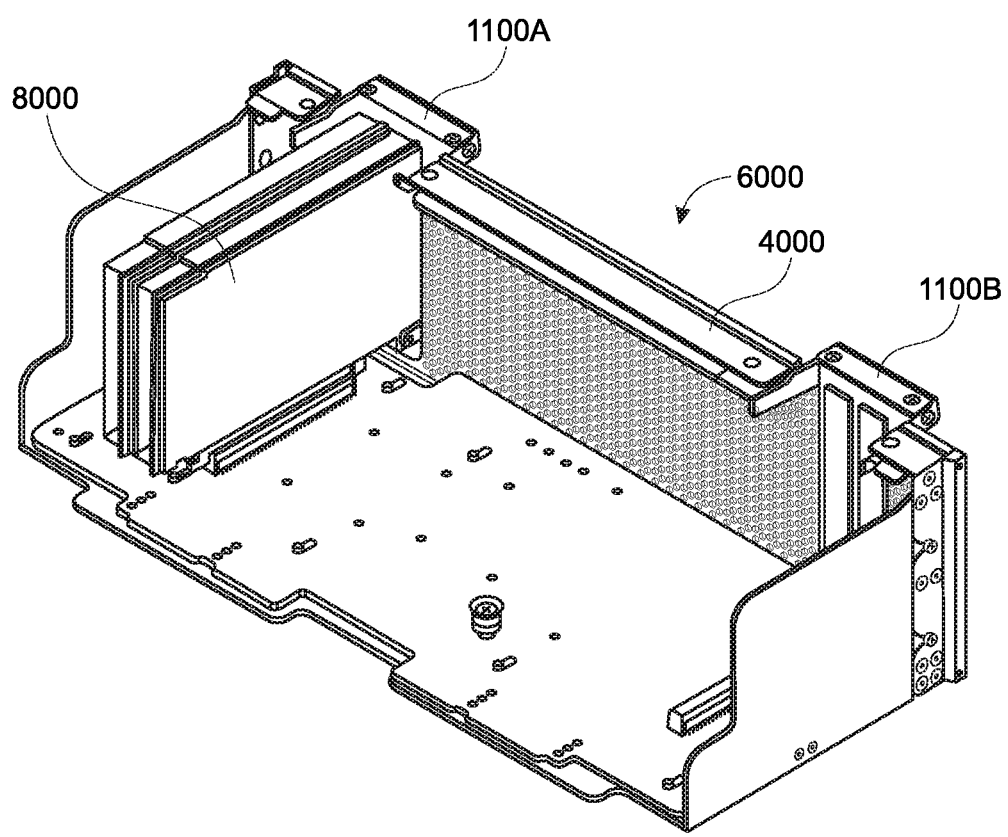
FIG. 18 illustrates multiple add-on cards secured within the server device by the locking mechanism, in accordance to one or more embodiments of the disclosure.

FIG. 18 illustrates multiple locking mechanisms 1100A and 1100B. The locking mechanism 1100A is illustrated in the disengaged position. Add-on cards 8000 are mounted in the server device 6000 by the locking mechanism 1100A. The add-on cards 8000 are within the server device 6000 but are not secured. As illustrated in FIG. 18, the locking mechanism 1100A is in the disengaged position. In contrast, the locking mechanism 1100B is in the engaged position. The engaged position of the locking mechanism secures the add-on card by interfacing the securing elements of the tray device 4000 with the apertures of the fixed structure 1110. This mating locks the add-on card in place due to the engagement elements on the add-on cards. This is discussed in further detail below with respect to FIGS. 20A and 20B.

Figure 19A:
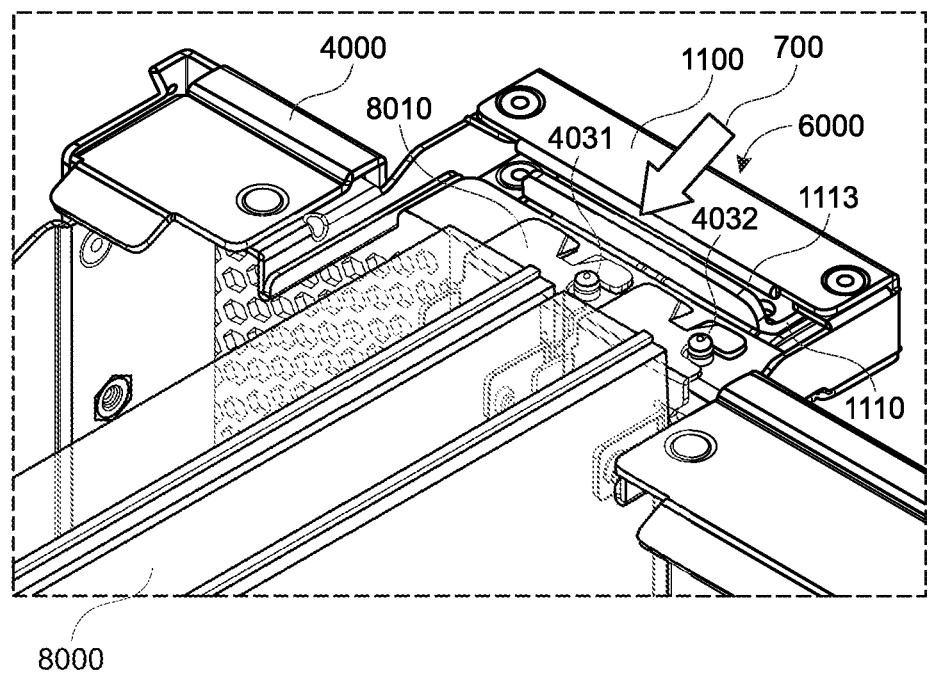
FIG. 19A illustrates a first force applied to engage the locking mechanism within a server device, in accordance to one or more embodiments of the disclosure.
Figure 19B:
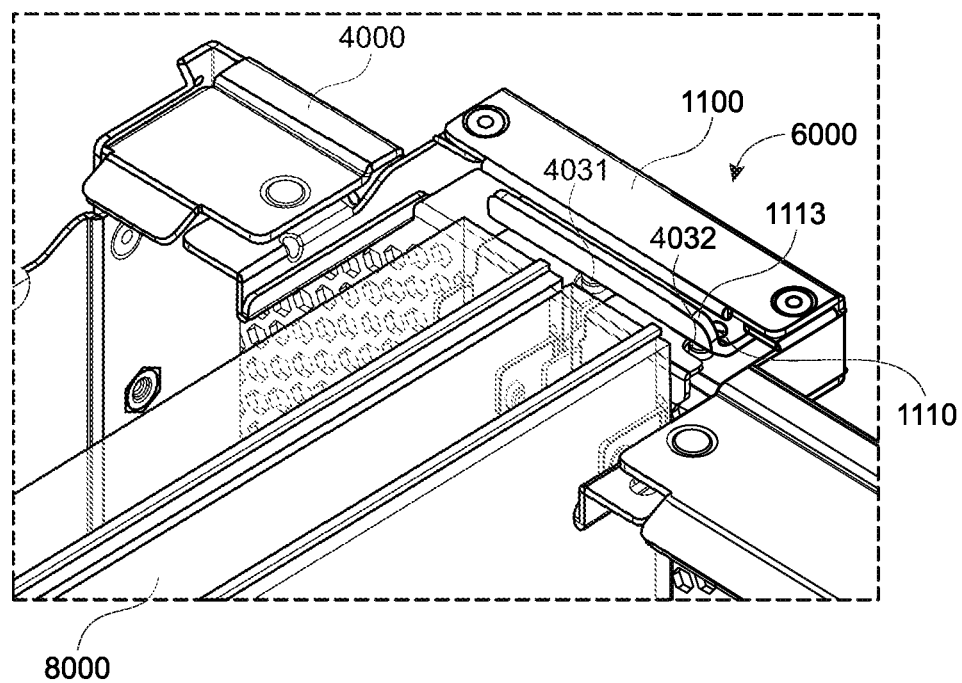
FIG. 19B illustrates a second force applied to engage the locking mechanism within a server device, in accordance to one or more embodiments of the disclosure.
Figure 19C:
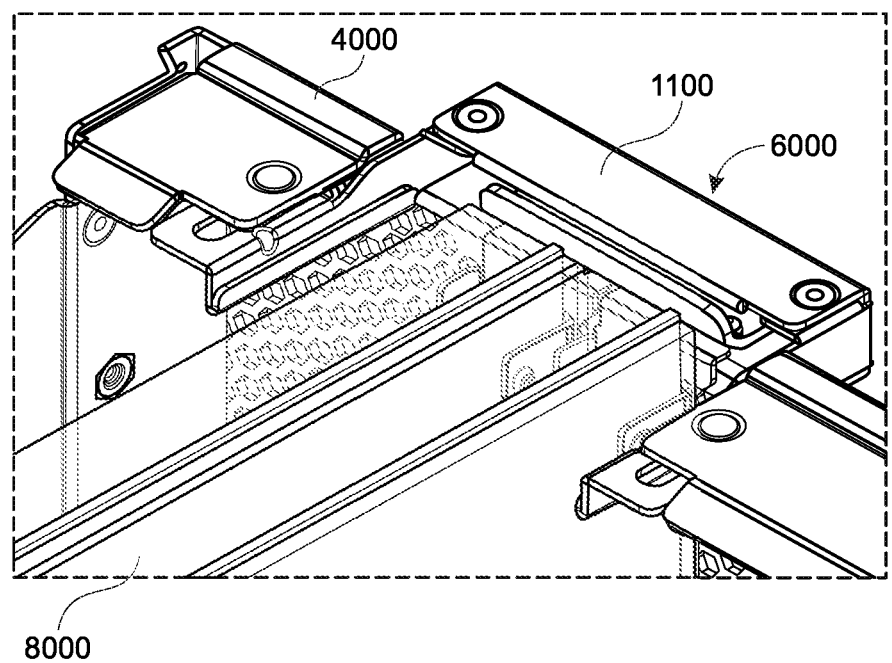
FIG. 19C illustrates an engaged locking mechanism securing an add-on card within a server device, in accordance to one or more embodiments of the disclosure.
Figure 20A:
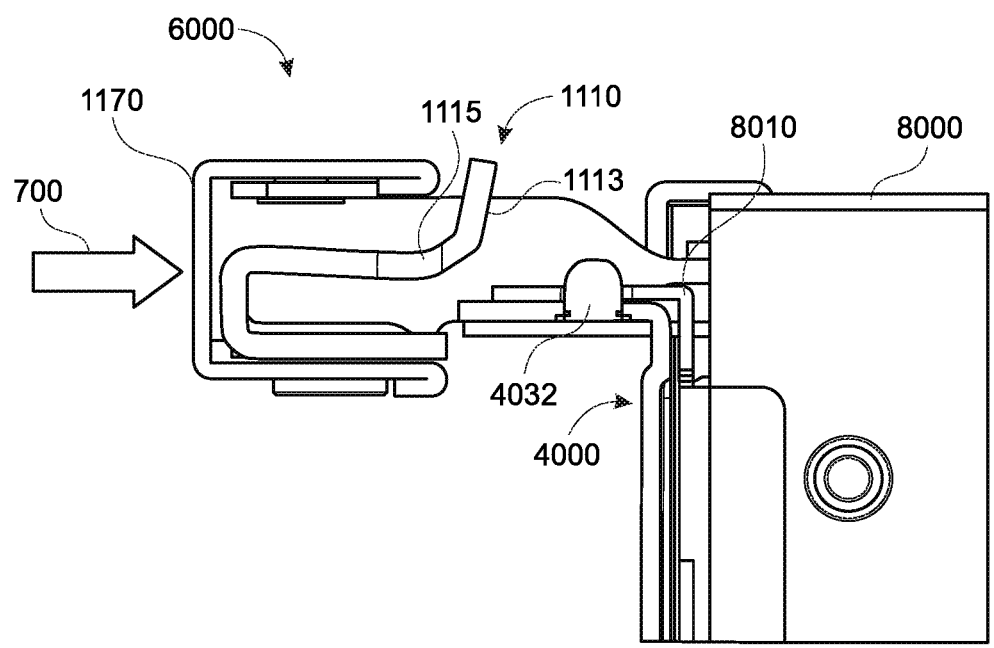
FIG. 20A illustrates a side profile of applying a force to engage the locking mechanism within a server device, in accordance to one or more embodiments of the disclosure.
Figure 20B:
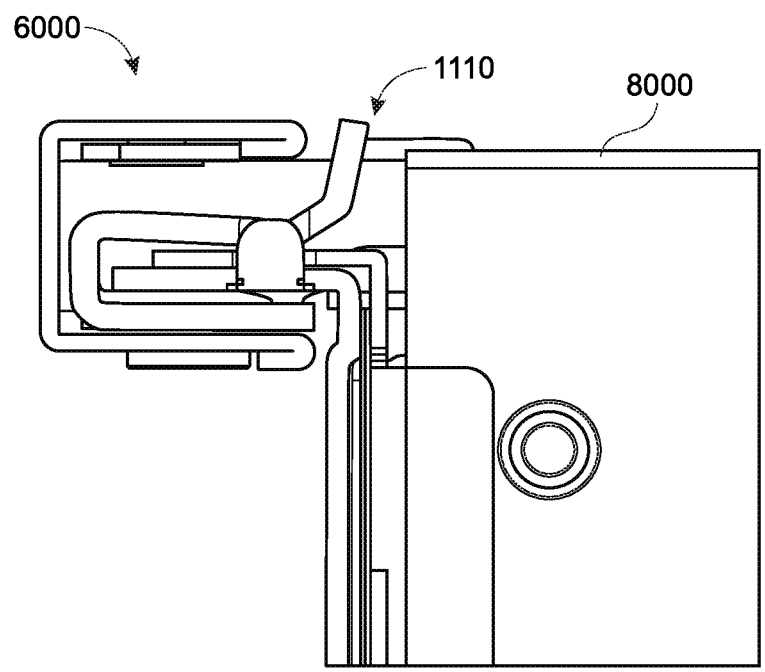
FIG. 20B illustrates a side profile of engaged locking mechanism securing an add-on card within a server device, in accordance to one or more embodiments of the disclosure.

FIG. 19A illustrates a force 700 applied to engage the locking mechanism 1100 within the server device 6000. The add-on card 8000 can each have an engagement element 8010 configured to connect with the securing elements 4032, 4031 of the tray device 4000. The engagement element 8010 is configured to interface with the securing elements 4032, 4031 upon initial placement within the server device 6000. The force 700 applied to the lip feature 1113 causes the locking engagement 1100 to move forward towards the add-on cards 8000. FIG. 19B illustrates the engagement of the securing elements 4032, 4031 with the lip feature 1113. As force 700 is continually applied, the securing elements 4032, 4031 advance past the lip feature 1113 until they interlock with the apertures (not visible in FIG. 19B, but described above [1115, 1116] with respect to FIG. 12B) of the fixed structure 1110, such that the two pieces are mated together. This is illustrated in FIGS. 20A and 20B. FIG. 19C illustrates the engaged locking mechanism 1100 securing the add-on card 8000 within a server device 6000.

FIG. 20A illustrates a side profile of applying the force 700 to engage the locking mechanism 1100 to secure the add-on card 8000. As the fixed structure 1110 is advanced towards the add-on card 8000, the lip feature 1113 will contact the securing element 4032 on the tray device 4000. Upon making contact with the securing element 4032, the locking mechanism 1100 is continuously advanced towards the add-on card 8000 until the securing element 4032 is locked into the aperture 1115. Once the securing element 4032 is locked into the aperture 1115, the add-on card is secured within the server device 6000. FIG. 20B illustrates a side profile of the engaged locking mechanism 1100 securing the add-on card 8000 within the server device 6000.

While particular embodiments of the present invention have been shown and described, it will be obvious to those skilled in the relevant arts that changes and modifications may be made without departing from the invention in its broader aspects. Therefore, the aim in the appended claims is to cover all such changes and modifications that fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

The terminology used herein is for the purpose of describing particular embodiments only and is not intended to limit the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. An apparatus for securing an electronic component within a server device, the apparatus comprising:
    a support bracket configured to secure the apparatus within the server device, the support bracket having a receiving area with a proximal internal surface and a distal internal surface:
    a fixed structure rotatably housed within the receiving area of the support bracket, the fixed structure having an elongated body with a proximal end and an opposing distal end, the elongated body extending along the receiving area of the support bracket and being rotatably mounted to the support bracket via two pivot elements that are oppositely and respectively positioned at the proximal and distal ends of the fixed structure, the proximal end of the fixed structure being covered by the proximal internal surface of the support bracket, the distal end of the fixed structure being covered by the distal internal surface of the support bracket; and
    a pair of hook structures including a first hook structure and a second hook structure, the first hook structure being fixedly connected to the proximal end of the fixed structure, the second hook structure being fixedly connected to the distal end of the fixed structure the pair of hook structures and the fixed structure being together rotatable between an engaged position and a disengaged position,
    wherein each of the pair of hook structures includes a notch element configured to secure a corresponding element on the electronic component; and
    wherein at least one of the pair of hook structures has a first crest feature and a second crest feature separated by a trough feature.

2. The apparatus of claim 1, wherein the notch element is located between the first crest feature and the trough feature.

3. The apparatus of claim 1, wherein at least one of the pair of hook structures has a pressing region located at the first crest feature, wherein the pressing region is configured to receive a force that causes the at least one of the pair of hook structures and fixed structure to rotate between the engaged position and the disengaged position.

4. The apparatus of claim 1, wherein the support bracket has at least one aperture corresponding with at least one aperture of the server device to secure the apparatus within the server device.

5. A server device comprising:
- a tray device configured to secure at least one apparatus of claim 1; and
- at least one add-on card configured to be secured within the server device by the at least one apparatus of claim 1.

6. The server of claim 5, wherein the tray device includes a bridge component configured to secure the support bracket.

7. An apparatus for securing an electronic component within a server device, the apparatus comprising:
- a support bracket configured to secure the apparatus within the server device, the support bracket having a receiving area; and a fixed structure having an elongated body with a proximal end and an opposing distal end, the elongated body being mounted within the support bracket in the receiving area such that the support bracket and the fixed structure are together slideable nonrotationally between an engaged position and a disengaged position to secure the electronic component within the server device, and an opening extending between the proximal end and the opposing distal end, the opening being configured to receive securing elements of a tray device; and
- wherein the support bracket has elongated apertures along which the support bracket slides nonrotationally between the engaged position and the disengaged position; and
- wherein the fixed structure comprises a lip feature and at least one aperture configured to secure a corresponding element on the server device.

8. The apparatus of claim 7, wherein the lip feature is configured to receive a force to cause the support bracket and fixed structure to slide between the engaged position and the disengaged position.

9. The apparatus of claim 7, wherein in the engaged position, the apparatus is configured to lock an attachment between an engagement element of the electronic component and a securing element of the server device.

* * * * *